(12) United States Patent
Takahashi et al.

(10) Patent No.: US 7,763,153 B2
(45) Date of Patent: Jul. 27, 2010

(54) METHOD AND APPARATUS FOR FORMING A CRYSTALLINE SILICON THIN FILM

(75) Inventors: Eiji Takahashi, Kyoto (JP); Hirokazu Kaki, Kyoto (JP)

(73) Assignee: Nissin Electric Co., Ltd., Kyoto (JP)

( * ) Notice: Subject to any disclaimer, the term of this patent is extended or adjusted under 35 U.S.C. 154(b) by 575 days.

(21) Appl. No.: 11/524,449

(22) Filed: Sep. 21, 2006

(65) Prior Publication Data

US 2007/0123004 A1     May 31, 2007

(30) Foreign Application Priority Data

Sep. 26, 2005     (JP)     ............... 2005-277047

(51) Int. Cl.
   *C23C 14/00*     (2006.01)
(52) U.S. Cl. .............. 204/298.01; 204/298.04; 204/298.26
(58) Field of Classification Search ........... 204/192, 204/298, 25, 3, 298.04, 298.01, 298.26; 438/149
   See application file for complete search history.

(56) References Cited

U.S. PATENT DOCUMENTS

| | | | |
|---|---|---|---|
| 7,141,492 B2 * | 11/2006 | Yudasaka | 438/497 |
| 2001/0041396 A1 * | 11/2001 | Yamazaki et al. | 438/151 |
| 2002/0009546 A1 * | 1/2002 | Koike et al. | 427/255.27 |
| 2002/0192394 A1 * | 12/2002 | Ebe et al. | 427/569 |
| 2007/0056846 A1 | 3/2007 | Takahashi et al. | |
| 2007/0063183 A1 | 3/2007 | Kato et al. | |
| 2007/0158182 A1 | 7/2007 | Takahashi et al. | |

| | | |
|---|---|---|
| 2008/0035471 A1 | 2/2008 | Mikami et al. |

FOREIGN PATENT DOCUMENTS

| | | |
|---|---|---|
| JP | 05-218368 | 8/1993 |
| JP | 05-234919 | 9/1993 |
| JP | 08-124852 | 5/1996 |
| JP | 11-054432 | 2/1999 |
| JP | 2000-195810 | 7/2000 |
| JP | 2004-083299 | 3/2004 |
| WO | WO-2005/093119 | 6/2005 |
| WO | WO-2005/093797 | 6/2005 |
| WO | WO-2005/093798 | 6/2005 |
| WO | WO-2005/094140 | 6/2005 |

OTHER PUBLICATIONS

Partial Translation of Kanagawa-Ken Sangyo Gijutu Sougou Kenkyusho Research Report No. Sep. 2003, pp. 77-78.

* cited by examiner

*Primary Examiner*—H. Jey Tsai
(74) *Attorney, Agent, or Firm*—Cheng Law Group, PLLC

(57) ABSTRACT

A hydrogen gas is supplied into a deposition chamber accommodating a silicon sputter target and a deposition target object, a high-frequency power is applied to said gas to generate plasma exhibiting Hα/SiH* from 0.3 to 1.3 between an emission spectral intensity Hα of hydrogen atom radicals at a wavelength of 656 nm and an emission spectral intensity SiH* of silane radicals at a wavelength of 414 nm in plasma emission, and chemical sputtering is effected on the silicon sputter target by the plasma to form a crystalline silicon thin film on the deposition target object. Thereafter a high-frequency power is applied to a terminally treating gas to generate plasma for terminating treatment and the surface of the crystalline silicon thin film is terminally treated by the plasma in the terminally treating chamber.

3 Claims, 2 Drawing Sheets

METHOD AND APPARATUS FOR FORMING A CRYSTALLINE SILICON THIN FILM

This invention is based on Japanese Patent Application No. 2005-277047 filed in Japan on Sep. 26, 2005, the entire content of which is hereby incorporated by reference.

BACKGROUND OF THE INVENTION

1. Field of the Invention

The present invention relates to a method and an apparatus for forming a crystalline silicon thin film.

2. Description of Related Art

Polycrystalline silicon, nanocrystalline silicon and others have been known as crystalline silicon, and these can be used for various purposes.

Polycrystalline silicon thin films have been used, e.g., as materials of TFT (thin film transistor) switches arranged at pixels in liquid crystal display devices as well as materials of various integrated circuits, solar cells and others. It has been expected to use nanocrystalline silicon in nonvolatile memories, light emitting elements and optical sensitizers.

For example, known methods of forming the polycrystalline silicon thin film include (1) a method wherein a deposition target substrate is kept at a temperature of 800 deg. C. or higher, and a CVD method such as a plasma CVD method or a PVD method such as a sputtering vapor deposition method is effected at a lower pressure (see, e.g., JP5-234919A and JP11-54432A), and (2) a method wherein an amorphous silicon thin film is formed at a relatively low temperature by a method among various CVD and PVD methods, and thereafter a heat treatment at about 1000 deg. C. or a long-time heat treatment at about 600 deg. C. is effected on the amorphous silicon thin film as a post-treatment (see, e.g., JP5-218368A).

Such a method is also known that laser annealing is effected on an amorphous silicon film to crystallize the film (see, e.g., JP8-124852A).

In addition to the above, such a method has been proposed that plasma of a gas prepared by diluting a silane-containing gas such as monosilane ($SiH_4$) or disilane ($Si_2H_6$) with hydrogen or silicon fluoride (SiF) is prepared and, in this plasma, a crystalline silicon thin film is directly formed on a substrate at a low temperature of about 500 deg. C. or lower (see, e.g. JP 2000-195810A).

By the way, crystalline silicon thin films are preferably those having a surface subjected to terminating treatment with oxygen, nitrogen or the like. The term "terminating treatment" used herein refers to a treatment wherein, e.g. oxygen and/or nitrogen is bonded to the surface of the crystalline silicon thin film to give a (Si—O) bond, a (Si—N) bond, a (Si—O—N) bond or the like.

The oxygen bond or nitrogen bond formed by such terminating treatment can function so as to compensate a defect, e.g., dangling bond, on the surface of the terminally untreated crystalline silicon thin film and thereby substantially give a suppressed state of the defect as a whole. When employed as materials of electronic devices, the terminally treated crystalline silicon thin films can achieve improvements in the properties required for the electronic devices.

For example, when used as a TFT material, the terminally treated crystalline silicon thin film enhances an electron mobility in the TFT, reduces OFF-current and increases reliability as to scarce variation in volt-ampere characteristic even in a long-time use of the TFT.

The terminating treatment is referred to in the method for forming a nanocrystalline silicon structure terminally treated with oxygen or nitrogen as described in JP 2004-83299A.

However, among conventional methods for forming a crystalline silicon thin film, a method involving heating a deposition target substrate to a high temperature requires a highly heat-resistant expensive substrate (e.g., silica glass substrate) as a substrate on which a film is formed. For example, it is difficult to form a crystalline silicon thin film on, e.g. an inexpensive low-melting point glass substrate having a heat resistant temperature of 500 deg. C. or lower (typically non-alkali glass substrate). This increases the production cost of crystalline silicon thin films in terms of the substrate cost. In the case of heat-treating an amorphous silicon film at a high temperature, the same problem is posed.

When an amorphous silicon film is subjected to a laser annealing process, a crystalline silicon film can be formed at a relatively low temperature. In this case, however, a laser irradiation step is required, and laser beams of an extremely high energy density must be emitted. For these and other reasons, the producing cost of the crystalline silicon thin film in this case is likewise high.

Further it is difficult to uniformly irradiate each part of the film with laser beams, and the laser irradiation may cause desorption of hydrogen, possibly resulting in a rough surface of the film so that difficulty is incurred in obtaining a crystalline silicon thin film of good quality.

In the method wherein a crystalline silicon thin film is formed directly on the substrate at a relatively low temperature with the plasma formed of a silane-containing gas diluted with a hydrogen gas or silicon fluoride (SiF), a film deposition rate is lowered because of using a silane-containing gas diluted with hydrogen or the like. The monosilane gas would incur a risk of causing a spontaneous ignition in the air.

The method for forming a nanocrystal silicon structure described in JP 2004-83299A presents the same problem as in formation of the conventional crystalline silicon thin film described above in that a silicon thin film of nanometer-scale thickness comprising silicon minute crystals and amorphous silicon is formed prior to the terminating treatment by a thermal catalysis reaction of a gas containing a hydrogenated silicon gas and a hydrogen gas or by applying a high-frequency electric field to a gas containing a hydrogenated silicon gas and a hydrogen gas to form plasma to be used for film formation.

SUMMARY OF THE INVENTION

In view of the above, an object of the present invention is to provide a method for forming a crystalline silicon thin film, the method being capable of forming a crystalline silicon thin film inexpensively at a relatively low temperature as compared with the conventional crystalline silicon thin film forming methods involving heating of the deposition target substrate, heat-treating of the amorphous silicon film or laser annealing of the amorphous silicon film, and in safety as compared with the case where the monosilane gas is used, and capable of easily obtaining a crystalline silicon thin film subjected to the terminating treatment from the crystalline silicon thin film thus formed.

It is another object of the invention to provide an apparatus for forming a crystalline silicon thin film, the apparatus being capable of forming a crystalline silicon thin film inexpensively at a relatively low temperature as compared with the conventional crystalline silicon thin film forming methods involving heating of the deposition target substrate, heat-treating of the amorphous silicon film or laser annealing of the amorphous silicon film, and in safety as compared with the case where the monosilane gas is used, and capable of easily obtaining a crystalline silicon thin film subjected to the terminating treatment from the crystalline silicon thin film thus formed.

The present inventors have carried out an extensive research to achieve the above objects and have obtained the following findings.

More specifically, when chemical sputtering (reactive sputtering) is effected on a silicon sputter target with such hydrogen gas-derived plasma that a ratio (Hα/SiH*) between an emission spectral intensity Hα of hydrogen atom radicals at a wavelength of 656 nm and an emission spectral intensity SiH* of silane radicals at a wavelength of 414 nm in plasma emission is 0.3 to 1.3, a stystalline silicon thin film can be formed on a deposition target object by an excitation effect of sputtered atoms and hydrogen plasma as well as a reaction of hydrogen radicals with the deposited film surface on the deposition target object, whereby a crystalline silicon thin film of good quality exhibiting crystallinity and having a low surface roughness like the conventional silicon thin film formed with the plasma derived from the silane-containing gas diluted with the hydrogen gas can be obtained.

Moreover, the crystalline silicon thin film which is not yet subjected to the terminating treatment can be formed at a relatively low temperature. For example, it is possible to form such crystalline silicon thin film on an inexpensive, low-melting point glass substrate (typically non-alkali glass substrate) with a heat resistant temperature of, e.g., 500 deg. C. or lower, so that it is possible to form the crystalline silicon thin film on the deposition target object so inexpensively. It is also possible to form the crystalline silicon thin film in safety, since the monosilane gas is not used.

The crystalline silicon thin film thus formed can be exposed to plasma formed of an oxygen-containing gas and/or a nitrogen-containing gas. Thereby, a crystalline silicon thin film terminally treated by oxygen and/or nitrogen can be easily obtained.

Based on the above findings, the invention provides a method for forming a crystalline silicon thin film, including:

a step of supplying a hydrogen gas into a deposition chamber accommodating a silicon sputter target and a deposition target object therein, generating plasma exhibiting a ratio (Hα/SiH*) of 0.3 to 1.3 between an emission spectral intensity Hα of hydrogen atom radicals at a wavelength of 656 nm and an emission spectral intensity SiH* of silane radicals at a wavelength of 414 nm in plasma emission inside the deposition chamber, effecting chemical sputtering with the plasma on the silicon sputter target to form, on the deposition target object, a crystalline silicon film; and a terminally treating step of applying a high-frequency power to at least one terminally treating gas selected from an oxygen-containing gas and a nitrogen-containing gas to form plasma for terminating treatment, and terminally treating the surface of the crystalline silicon thin film with the plasma thus formed.

Based on the foregoing findings, the invention also provides an apparatus for forming a crystalline silicon thin film including: a deposition chamber having an object holder for supporting a deposition target object; a silicon sputter target arranged in said deposition chamber; a hydrogen gas supply device supplying a hydrogen gas into said deposition chamber; an exhaust device exhausting a gas from said deposition chamber; a high-frequency power applying device applying a high-frequency power to the hydrogen gas supplied into said deposition chamber from said hydrogen gas supply device, and thereby forming plasma for effecting chemical sputtering on said silicon sputter target; an optical emission spectroscopic analyzer for plasma obtaining an emission intensity ratio (Hα/SiH*) between an emission spectral intensity Hα of hydrogen atom radicals at a wavelength of 656 nm and an emission spectral intensity SiH* of silane radicals at a wavelength of 414 nm in plasma emission derived from the plasma for chemical sputtering inside said deposition chamber; and a terminally treating device for terminally treating a surface of the crystalline silicon thin film formed on the deposition target object with plasma for terminating treatment generated by applying a high-frequency power to at least one terminally treating gas selected from an oxygen-containing gas and a nitrogen-containing gas.

The foregoing and other objects, features, aspects and advantages of the present invention will become more apparent from the following detailed description when taken in conjunction with accompanying drawings.

BRIEF DESCRIPTION OF THE DRAWINGS

FIG. 2 (B) is a block diagram of a circuit example controlling an exhaust amount of the exhaust device.

DESCRIPTION OF PREFERRED EMBODIMENTS

Figure 1:
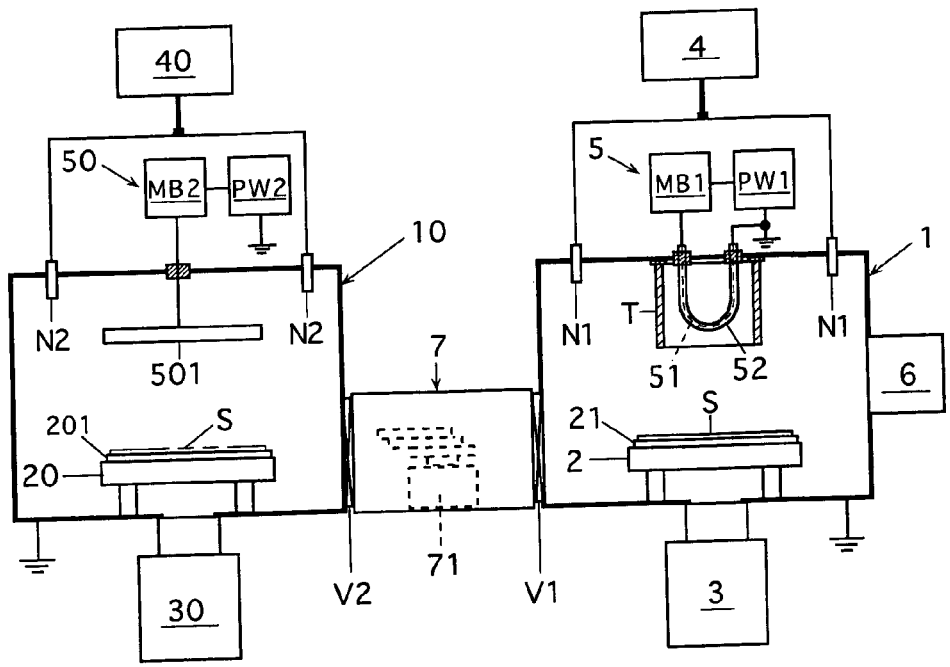
FIG. 1 shows a schematic structure of an example of the apparatus for forming a crystalline silicon thin film according to the invention.

The crystalline silicon thin film forming method according to preferred embodiments of the invention comprises:

a step of supplying a hydrogen gas into a deposition chamber accommodating a silicon sputter target and a deposition target object therein, generating plasma exhibiting a ratio (Hα/SiH*) of 0.3 to 1.3 between an emission spectral intensity Hα of hydrogen atom radicals at a wavelength of 656 nm and an emission spectral intensity SiH* of silane radicals at a wavelength of 414 nm in plasma emission inside the deposition chamber, effecting chemical sputtering with the plasma on the silicon sputter target to form, on the deposition target object, a crystalline silicon film; and a terminally treating step of applying a high-frequency power to at least one terminally treating gas selected from an oxygen-containing gas and a nitrogen-containing gas to form plasma for terminating treatment, and terminally treating the surface of the crystalline silicon thin film with the plasma thus formed.

The term "SiH*." represents an emission spectral intensity (wavelength 414 nm) of silane radicals which are generated by sputtering the silicon sputter target with the hydrogen gas plasma produced from the hydrogen gas supplied into the deposition chamber to which a high-fluency power is applied and exist in the plasma. The term "Hα" represents an emission spectral intensity of the hydrogen atom radicals showing a peak at a wavelength of 656 nm in spectroscopic analysis of light emission derived from the plasma.

The "Hα/SiH*" shows that the hydrogen radicals are rich in the plasma. When this value is lower than 0.3, the film thus formed is lower in crystallinity, whereas when the value exceeds 1.3, the formation of the film becomes difficult. The value of Hα/SiH* can be obtained based on a measurement result obtained by measuring the emission spectrums of various radicals with an optical emission spectroscopic analyzer for plasma. The control of Hα/SiH* can be performed by controlling at least one of the magnitude of a high-frequency power applied to the hydrogen gas, gas pressure in film deposition, supply amount of hydrogen gas, etc.

In a typical example, the application of the high-frequency power to the hydrogen gas may be performed in an inductive coupling manner utilizing discharging from a high-frequency discharge electrode to the deposition chamber. Thereby, an inner space of the deposition chamber becomes rich in hydrogen radicals and hydrogen ions.

The inventors observed that the Hα (656 nm) and Hβ (486 nm) become dominant in the plasma when producing the plasma of the hydrogen gas in the inductive coupling manner and performing spectroscopic analysis of light emission derived from the plasma.

The richness with the Hα and the Hβ means that the hydrogen radical concentration is high. This is significantly different from the case of the plasma production by a capacitive coupling method which provides a state that the Hα and the Hβ are poor.

The plasma potential of the plasma formed by the application of a high-frequency power to the hydrogen gas in the inductive coupling manner is, e.g., about 20 eV and is very low in any case, although it depends on conditions. Therefore, a usual physical sputtering is unlikely to occur.

However, the inventors observed the presence of Si (288 nm) by spectroscopic analysis of light emission derived from the plasma. This is caused by chemical sputtering (reactive sputtering) with the hydrogen radicals and hydrogen ions at the surface of the silicon sputter target.

The high-frequency discharge electrode for application of the high-frequency power to the hydrogen gas may be arranged outside the deposition chamber, or may be arranged inside the deposition chamber for efficient power application. When it is arranged outside the deposition chamber, a wall portion of the deposition chamber opposed to the high-frequency discharge electrode may be made of a dielectric material.

When the electrode is arranged inside the deposition chamber, it is preferable to coat a surface of a conductive potion of the electrode with an electrically insulating material. When coating the surface of the electrode conductive portion with the electrically insulating material, the electrode is suppressed from being sputtered with charged particles derived from the plasma due to a self-bias, and the sputtered particles coming from the electrode are suppressed from incorporation into the film to be deposited.

The insulating material may be a silica glass, or may be a material prepared by anode oxidation of the electrode.

The silicon sputter target can be provided in various states. For example, a whole or a part of a portion of the deposition chamber to be contacted with the plasma [e.g., an inner wall of the deposition chamber to be easily contacted with the plasma (which may be an inner wall arranged inside the chamber wall)] may be coated with silicon by silicon film formation, adhesion of silicon wafer, attachment of a silicon piece or the like to provide the silicon sputter target. A silicon sputter target independent of the deposition chamber itself may be arranged inside the deposition chamber.

Irrespectively of whether the high-frequency discharge electrode is arranged outside the deposition chamber, or inside the deposition chamber, it is preferable for smooth chemical sputtering of the silicon sputter target that the silicon sputter target is located in a position opposed to at least the high-frequency discharge electrode which is a plasma generation region, in other words, in a position near the high-frequency discharge electrode.

For example, when the high-frequency discharge electrode is located inside the deposition chamber, the silicon sputter target opposed to the high-frequency discharge electrode may be a silicon sputter target of a cylindrical form which surrounds the electrode and is opened toward the deposition target object.

In any one of the above cases, the potential of the plasma in formation of the crystalline silicon thin film is preferably substantially in a range from 15 eV to 45 eV, and an electron density is preferably substantially in a range from $10^{10}$ pcs (pieces)/cm$^3$ to $10^{12}$ pcs/cm$^3$.

The deposition chamber pressure (deposition pressure) in formation of the crystalline silicon thin film is preferably substantially in a range from 0.6 Pa to 13.4 Pa (from about 5 mTorr to about 100 mTorr).

When the potential of the plasma for forming the crystalline silicon thin film is lower than 15 eV, the crystallinity lowers. When it is higher than 45 eV, the crystallinity is likely to become impaired.

When the electron density in the plasma is smaller than $10^{10}$ pcs/cm$^3$, the crystallinity lowers, and/or the deposition rate lowers. When it is larger than $10^{12}$ pcs/cm$^3$, the film and the deposition target object are liable to be damaged.

When the deposition chamber pressure for forming the crystalline silicon thin film is lower than 0.6 Pa (about 5 mTorr), the plasma becomes unstable, and the deposition rate lowers. When it is higher than 13.4 Pa (about 100 mTorr), the plasma becomes unstable, and the crystallinity of the film lowers.

The plasma potential and the electron density of the plasma can be adjusted by controlling at least one of the magnitude of the applied high-frequency power, frequency of the power, deposition pressure and others.

In executing the terminating treatment step, the following process may be performed, if a difficulty is not found. The terminally treating gas is supplied into the deposition chamber after crystalline silicon thin film formation step. Then a high-frequency power is applied to the gas to generate plasma for terminating treatment, and the surface of the crystalline silicon thin film is terminally treated with the plasma thus formed.

Optionally a terminally treating chamber may be arranged independently of the deposition chamber, and the terminally treating step may be performed in the terminally treating chamber.

After executing the crystalline silicon thin film forming step in the deposition chamber, the deposition target object bearing the crystalline silicon thin film may be transferred to the terminally treating chamber connected to the deposition chamber, and the terminally treating step may be performed in the terminally treating chamber. The terminally treating chamber may be directly connected to the deposition chamber or may be indirectly connected thereto via, e.g., a transferring chamber having an object transferring robot.

A high-frequency discharge electrode for application of the high-frequency power to the terminally treating gas may be of the type generating an inductively coupled plasma in the terminating treatment in the terminally treating chamber.

Useful terminally treating gases include an oxygen-containing gas such as oxygen gas, nitrogen oxide ($N_2O$) gas, and a nitrogen-containing gas such as nitrogen gas and ammonia ($NH_3$) gas.

The crystalline silicon thin film forming apparatus according to embodiments of the invention is as follows.

It is a crystalline silicon thin film forming apparatus comprising a deposition chamber having an object holder for supporting a deposition target object; a silicon sputter target arranged in said deposition chamber; a hydrogen gas supply device supplying a hydrogen gas into said deposition chamber; an exhaust device exhausting a gas from said deposition chamber; a high-frequency power applying device applying a high-frequency power to the hydrogen gas supplied into said deposition chamber from said hydrogen gas supply device, and thereby forming plasma for effecting chemical sputtering on said silicon sputter target; an optical emission spectroscopic analyzer for plasma obtaining an emission intensity ratio (Hα/SiH*) between an emission spectral intensity Hα of hydrogen atom radicals at a wavelength of 656 nm and an emission spectral intensity SiH* of silane radicals at a wavelength of 414 nm in plasma emission derived from the plasma for chemical sputtering inside said deposition chamber; and a terminally treating device for terminally treating a surface of the crystalline silicon thin film formed on the deposition target object with plasma for terminating treatment generated by applying a high-frequency power to at least one terminally treating gas selected from an oxygen-containing gas and a nitrogen-containing gas.

The crystalline silicon thin film forming apparatus may further include a control portion comparing the emission intensity ratio (Hα/SiH*) obtained by the optical emission spectroscopic analyzer for plasma with a reference value predetermined within a range from 0.3 to 1.3, and controlling at least one of the magnitude of the power to be applied by the high-frequency power applying device, a supply amount of the hydrogen gas supplied from the hydrogen gas supply device into the deposition chamber and an exhaust amount of the exhaust device such that the emission intensity ratio (Hα/SiH*) in the plasma in the deposition chamber changes toward the reference value.

In this thin film forming apparatus, the high-frequency power applying device, which is provided for generating the plasma for chemical sputtering, may include a high-frequency discharge electrode arranged for the deposition chamber, and perform application of a high frequency power in an inductive coupling manner utilizing the discharging from the high-frequency discharge electrode.

Such high-frequency discharge electrode may be arranged in the deposition chamber. In that case, the silicon sputter target may be opposed to at least the high-frequency discharge electrode as described in respect of the thin film forming method.

When the high-frequency discharge electrode is disposed in the deposition chamber, a surface of a conductive portion of the high-frequency discharge electrode is preferably coated with an electrically insulating material.

The terminally treating device may include, for example, a terminally treating gas supply device supplying at least one terminally treating gas selected from an oxygen-containing gas and a nitrogen-containing gas into the deposition chamber, and a high-frequency power applying device for generating plasma for terminating treatment by applying a high-frequency power to the terminally treating gas supplied into the deposition chamber from the terminally treating gas supply device.

In the case of this terminally treating device, the high-frequency power applying device for generating the plasma for chemical sputtering may be utilized as the high-frequency power applying device for generating the plasma for terminating treatment by controlling the magnitude of the power, etc. when required.

Said exhaust device can be used in respect of exhaust device.

A terminally treating chamber may be employed independently of the deposition chamber.

The terminally treating device may include a terminally treating chamber which is connected to the deposition chamber and into which a deposition target object bearing the crystalline silicon thin film formed in the deposition chamber is transferred;

an exhaust device exhausting a gas from the terminally treating chamber;

a terminally treating gas supply device supplying at least one terminally treating gas selected from an oxygen-containing gas and a nitrogen-containing gas; and a high-frequency power applying device for applying a high-frequency power to the terminally treating gas supplied from the terminally treating gas supply device to generate the plasma for terminating treatment.

In this terminally treating device, the terminally treating chamber may be directly connected to the deposition chamber or may be indirectly connected to the deposition chamber via, e.g., a transferring chamber having an object transferring robot.

In the high-frequency power applying device for the terminally treating chamber, a high-frequency discharge electrode for generating an inductively coupled plasma may be employed as a high-frequency power applying electrode for applying a high-frequency power to the terminally treating gas.

Description will be given on embodiments of the present invention with reference to accompanying drawings.

FIG. 1 shows a schematic structure of an example of an apparatus for forming a terminally treated crystalline silicon thin film.

The apparatus shown in FIG. 1 is provided with a deposition chamber 1 which accommodates an object holder 2, a high-frequency power discharge electrode 51 disposed above the holder 2, and a silicon sputter target T opposed to the electrode.

The electrode 51 has a conductive portion with its surface coated with an electrically insulating material 52 composed of silica glass. To the electrode 51 is connected a high-frequency power source PW1 for discharge via a matching box MB1. The electrode 51, the matching box MB1 and the power source PW1 compose a high-frequency power applying device 5 applying a high frequency power to a hydrogen gas supplied into the deposition chamber as described later.

The power source PW1 is an output-variable power source, and can supply a high-frequency power of a frequency of, e.g., 13.56 MHz. The power source frequency is not restricted to 13.56 MHz, and may be selected, for example, in a range from about 60 megahertz to several hundreds of megahertz.

The object holder 2 includes a heater 21 for heating a deposition target object (a substrate S in this example). The object holder 2 is grounded together with the deposition chamber 1.

The silicon sputter target 2 has a cylindrical form surrounding and opposed to the electrode 51, and is attached to a top wall of the deposition chamber 1. The lower end of the cylindrical target T is opened toward the holder 2.

In addition to or instead of the target T, a silicon sputter target may be arranged on, e.g., a top wall portion of the deposition chamber surrounded by the illustrated target T. Such a target can be arranged, e.g., by holding a silicon wafer on the top wall portion by adhesion or the like. As described above, the silicon sputter target is arranged in a position where it can be easily brought into contact with the plasma formed in the deposition chamber 1.

A hydrogen gas supply device 4 is disposed for the deposition chamber 1. The hydrogen gas can be supplied into the chamber by the device 4 through gas inlet nozzles N1 arranged at a top wall portion of the deposition chamber 1 in a region outside the target T.

In addition to the above, an exhaust device 3 for exhausting a gas from the deposition chamber 1 is connected to the deposition chamber 1, and an optical emission spectroscopic analyzer 6 for plasma is also employed for measuring a state of the plasma formed in the deposition chamber 1.

The exhaust device 3 includes a conductance valve controlling an exhaust flow rate and an exhaust pump connected to the chamber 1 via the valve.

Figure 2A:
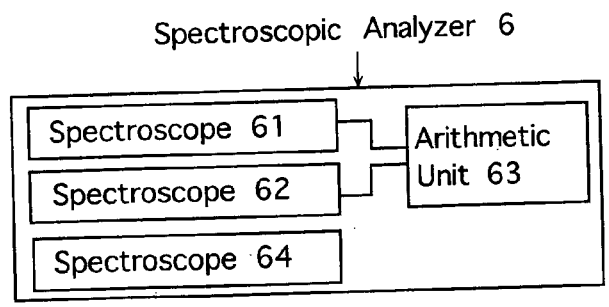
FIG. 2 (A) is a block diagram of an example of an optical emission spectroscopic analyzer for plasma.

The optical emission spectroscopic analyzer 6 for plasma includes, as shown in FIG. 2 (A), a spectroscope 61 detecting an emission spectral intensity SiH* (wavelength 414 nm) of the foregoing silane radicals as well as spectroscopes 62 and 64 detecting emission spectral intensities Hα (wavelength 656 nm) and Hβ (wavelength 486 nm) of the hydrogen.

The emission intensities SiH* and Hα detected by spectroscopes 61 and 62 are supplied to an arithmetic unit 63, which obtains an emission intensity ratio (Hα/SiH*). A photosensor with a filter may be employed instead of the spectroscope(s).

The crystalline silicon thin film forming apparatus shown in FIG. 1 has a terminally treating chamber 10 connected to the deposition chamber 1 via the substrate transferring chamber 7. An opening or shutting gate valve V1 is arranged between the substrate transferring chamber 7 and the deposition chamber 1. An opening or shutting gate valve V2 is arranged between the substrate transferring chamber 7 and the terminally treating chamber 10. A substrate transferring robot 71 is disposed in the substrate transferring chamber 7.

In the terminally treating chamber 10, an object holder 20 is arranged and a flat form high-frequency discharge electrode 501 is disposed above the holder 20.

The electrode 501 is connected to a discharge high-fluency power source PW2 via a matching box MB2. The electrode 501, matching box MB2 and power source PW2 form a high-fluency power applying device 50 which applies a high-fluency power to a terminally treating gas supplied into the terminally treating chamber 10 as described later.

The power source PW2 is an output-variable power source, and can supply a high-frequency power, e.g., at a frequency of 13.56 MHz. The power source frequency need not be restricted to 13.56 MHz.

The object holder 20 has a heater 201 for heating a deposition target substrate S bearing a crystalline silicon thin film formed in the deposition chamber 1 as described later. The object holder 20 is grounded together with the chamber 10.

A terminally treating gas supply device 40 is disposed for the terminally treating chamber 10. The terminally treating gas supply device 40 is arranged for the terminally treating chamber 10 and can supply a terminally treating gas from gas inlet nozzles N2 disposed at a top wall portion of the chamber 10. The terminally treating gas may be an oxygen gas or a nitrogen gas in this example.

In addition to the above, an exhaust device 30 exhausting a gas from the terminally treating chamber 10 is connected to the chamber 10. The exhaust device 30 includes a conductance valve controlling the exhaust amount and an exhaust pump connected to the chamber 10 via the valve.

Description will be given on examples of formation of crystalline silicon thin films terminally treated with oxygen or nitrogen on the substrate S according to the silicon thin film forming apparatus as described above.

In forming the films, the deposition gas pressure in the deposition chamber 1 is kept in a range from 0.6 Pa to 13.4 Pa. Although not shown in the figure, the deposition gas pressure can be detected, e.g., by a pressure sensor connected to the deposition chamber 1.

First, a crystalline silicon thin film is formed on the substrate S in the deposition chamber 1 prior to the terminating treatment.

The exhaust device 3 starts to exhaust the gas from the deposition chamber 1. The exhaust amount at that time is controlled in view of the deposition gas pressure of 0.6 Pa to 13.4 Pa in the chamber 1.

When the exhaust device 3 operates to lower the inner pressure of the deposition chamber 1 below an intended deposition gas pressure, the hydrogen gas supply device 4 opens to supply the hydrogen gas into the deposition chamber 1, and the output-variable power source PW1 applies the high-frequency power to the high-frequency discharge electrode 51 so that plasma is produced from the supplied hydrogen gas in an inductive coupling manner.

From the information detected by the optical emission spectroscopic analyzer 6 from the plasma thus produced, the Hα (656 nm) and the Hβ (486 nm) in the plasma are obtained.

By controlling at least one of the high-frequency power applied to the electrode 51, the amount of the hydrogen gas supplied into the chamber 1 and the deposition chamber gas pressure and others, the conditions such as the high-frequency power, the amount of the supplied hydrogen gas and others are determined such that the emission intensities Hα (656 nm) and Hβ (486 nm) in the plasma may be sufficiently large.

Moreover, the conditions such as the high-frequency power, the amount of the supplied hydrogen gas and others are determined such that the Hα/SiH* in the hydrogen plasma falls within a range from 0.3 to 1.3, the potential of the plasma falls within a range from 15 eV to 45 eV and the electron density in the plasma falls within a range from $10^{10}$ pcs/cm$^3$ to $10^{12}$ pcs/cm$^3$.

The plasma potential and the electron density can be confirmed, e.g., by a Langmuir probe method using a Langmuir probe inserted into the chamber 1 (not shown in the figure).

In view of the above, the final conditions such as the high-frequency power, amount of the supplied hydrogen gas and deposition gas pressure and others are determined.

After determining the deposition conditions in this way, the film deposition is performed according to the determined conditions.

In the film deposition, the heater 21 is set to heat the deposition target substrate S held by the holder 2 to a relatively low temperature not exceeding 500 deg. C., e.g., to about 400 deg. C., and the deposition target substrate S is placed on the holder 2.

Next, the exhaust device 3 exhausts the gas from the deposition chamber 1. Subsequently the hydrogen gas supply device 4 supplies a predetermined amount of hydrogen gas into the deposition chamber 1 and a high-frequency power is applied to the electrode 51 from the power source PW1. Discharge is effected from the electrode 51 in an inductive coupling manner, whereby plasma is generated.

Then, chemical sputtering (reactive sputtering) is effected on the silicon sputter target T opposed to the electrode 51 with the plasma, whereby a silicon thin film is formed on the substrate S. The deposited film is a crystalline silicon thin film, like conventional crystalline silicon thin films formed from the plasma generated from the gas obtained by diluting a silane-containing gas with a hydrogen gas.

When the substrate temperature is too low, the crystallization of silicon becomes difficult. Therefore a substrate temperature of substantially 200 deg. C. or higher is preferred although depending on other conditions.

Thereafter the substrate bearing the crystalline silicon thin film is transferred to the terminally treating chamber 10 to terminally treat the surface of the thin film with oxygen or nitrogen.

At this operation, the substrate S is transferred to the chamber 10 as follows. The gate valve V1 is opened, and the substrate S on the holder 2 is withdrawn by the robot 71 and is led into the substrate transferring chamber 7. Then the gate valve V1 is closed and the gate valve V2 is opened. Thereafter the substrate S is placed on the holder 20 in the chamber 10. Then, a movable portion of the robot is retracted into the substrate transferring chamber 7. Thereafter the gate valve V2 is closed and the terminating treatment is conducted in the chamber 10.

In the terminating treatment in the chamber 10, the substrate S is heated by the heater 201, when required, to a temperature suitable for the terminating treatment. Then the exhaust device 30 starts exhausting the gas from the chamber 10. When the inner pressure of the chamber 10 lowers below an intended terminally treating gas pressure, a predetermined amount of the terminally treating gas (oxygen gas or nitrogen gas in this example) is supplied from the terminally treating gas supply device 40 into the chamber 10, and the output-variable power source PW2 applies the high-frequency power to the high-frequency discharge electrode 501 so that plasma is produced from the supplied gas in a capacitive coupling manner.

With the plasma thus formed for terminating treatment, the terminating treatment is conducted with oxygen or nitrogen over the surface of the crystalline silicon thin film on the substrate S to obtain a terminally treated crystalline silicon thin film.

In the chamber 10, using a high-frequency discharge antenna as the high-frequency discharge electrode, inductively coupled plasma may be generated. In the chamber 1, using parallel flat form electrodes instead of the high-frequency discharge antenna 51, capacitively coupled plasma may be generated.

The terminally treating gas pressure in the terminally treating step may be, e.g., in a range of 0.2 Pa to 7.0 Pa although not restricted to the range.

The heating temperature of the substrate in the terminally treating step may be selected from a range of room temperature to about 500 deg. C. in view of feasibility of silicon thin film formation at a relatively low temperature in the deposition chamber 1 as well as heat resistance of the substrate S.

Description will be given on experimental examples of formation of terminally treated crystalline silicon thin films by an apparatus of the type shown in FIG. 1.

(1) Experimental Example 1

Formation of Crystalline Silicon Thin Film Terminally Treated with Oxygen (1-1) Crystalline Silicon Thin Film Forming Step
Substrate: Non-alkali glass substrate
Substrate temperature: 400 deg. C.
High-frequency power source: 13.56 MHz, 2000 W
Hydrogen gas supply amount: 50 sccm
Deposition pressure: 13 Pa (98 mTorr)
Hα/SiH* in plasma: 1.0
Plasma potential: 30 eV
Electron density in plasma: $10^{11}$ pcs/cm$^3$
Film thickness: about 500 Å

Figure 3:
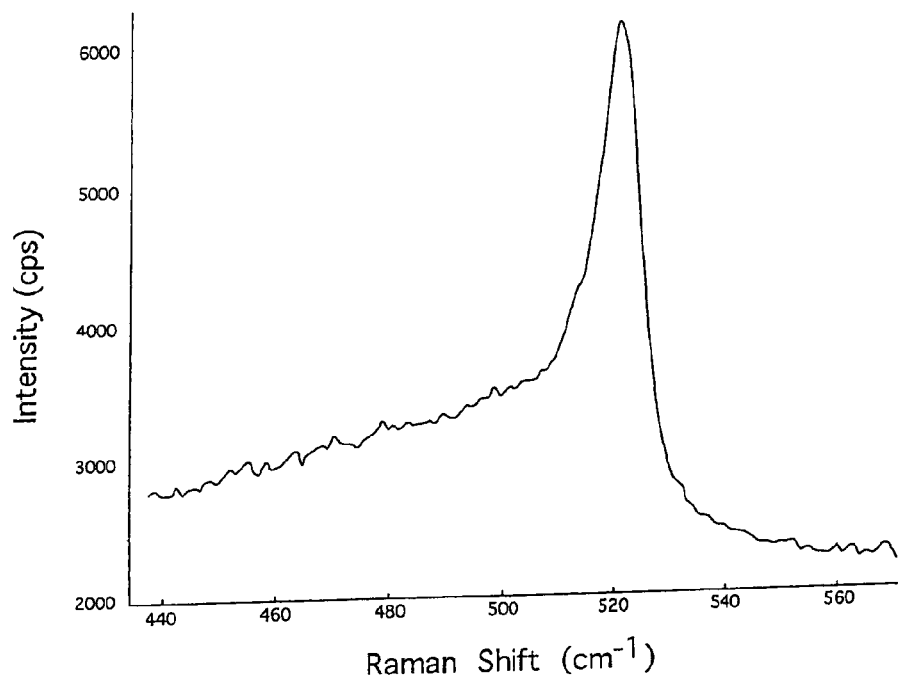
FIG. 3 illustrates a result of evaluation by a laser Raman spectroscopic analysis effected on the crystallinity of a terminally untreated silicon film formed in an experimental example.

A crystallinity of the film obtained in this example was evaluated by laser Raman spectroscopic analysis. According to the result, a peak exhibiting the crystallinity of Raman shift 520 cm$^{-1}$ was present as illustrated in FIG. 3, and the crystallinity was confirmed.

(1-2) Terminally Treating Step
Substrate temperature: 400 deg. C.
Oxygen gas supply amount: 100 sccm
High-frequency power source: 13.56 MHz, 1 kW
Terminally treating pressure: 0.67 Pa
Terminally treating time: 1 minute (2) Experimental Example 2

Formation of Crystalline Silicon Thin Film Terminally Treated with Nitrogen (2-1) Crystalline Silicon Thin Film Forming Step
As is the case with Experimental Example 1

(2-2) Terminally Treating Step
Substrate temperature: 400 deg. C.
Nitrogen gas supply amount: 200 sccm
High-frequency power source: 13.56 MHz, 1 kW
Terminally treating pressure: 0.67 Pa
Terminally treating time: 5 minutes The crystalline silicon thin film terminally treated with oxygen or nitrogen exhibited higher electron mobility indicating electric characteristics of the TFT than those terminally untreated, and exhibited lower OFF-current.

In the deposition of silicon thin film by the silicon thin film forming step prior to terminating treatment as already described, manual operations are performed for controlling the output of the power source PW1, the hydrogen gas supply amount of the hydrogen gas supply device 4, the exhaust amount of the exhaust device 3 determining the deposition chamber pressure and others.

Figure 2B:
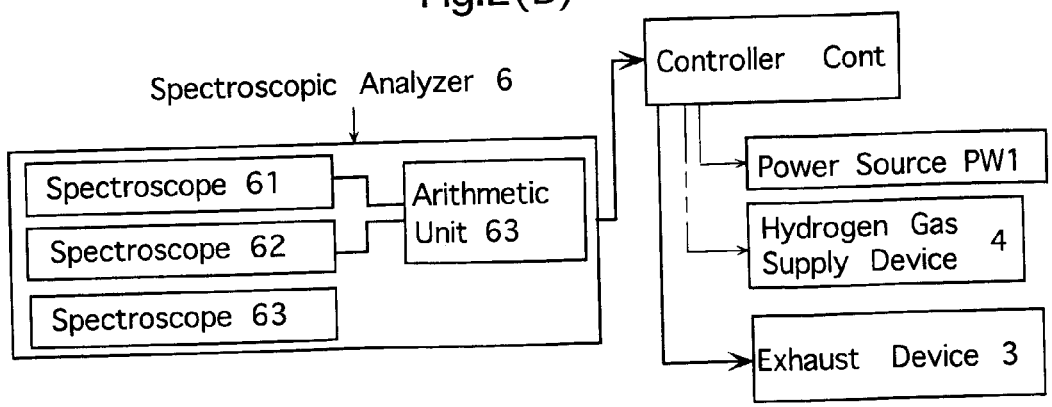

As illustrated in FIG. 2(B), however, the emission intensity ratio Hα/SiH* obtained by the arithmetic unit 63 of the optical emission spectroscopic analyzer 6 for plasma may be supplied to a controller Cont.

As the controller Cont, a controller may be employed which determines whether the emission intensity ratio Hα/SiH* provided from the arithmetic unit 63 is equal to a predetermined reference emission intensity ratio (reference value) or not, and controls, when it is not equal to the reference emission intensity ratio, at least one of the output of the output-variable power source PW1, the hydrogen gas supply amount of the hydrogen gas supply device 4 and the exhaust amount of the exhaust device 3.

As a specific example, the controller Cont may control the conductance valve (not shown) of the exhaust device 3 to control the exhaust amount of the device 3, and thereby the gas pressure in the deposition chamber 1 may be controlled to attain the reference emission intensity ratio.

In the above case, the initial values determined in advance by experiments or the like may be employed for the output of the output-variable power source PW1, the hydrogen gas supply amount of the hydrogen gas supply device 4, the exhaust amount of the exhaust device 3 and others such that the reference emission intensity ratio or a value close to it may be obtained.

When determining the above initial values, the exhaust amount of the exhaust device 3 is likewise determined to keep the pressure in the deposition chamber 1 within a range from 0.6 Pa to 13.4 Pa. Also the initial values are determined such that the potential of the plasma may fall within a range from 15 eV to 45 eV, and the electron density in the plasma may fall within a range from $10^{10}$ pcs/m$^3$ to $10^{12}$ pcs/m$^3$.

The output of the power source PW1 and the hydrogen gas supply amount of the hydrogen gas supply device 4 will be kept at the initial values, respectively, and the exhaust amount of the exhaust device 3 will be controlled by the controller Cont to achieve the reference emission intensity ratio.

Next, referring to FIG. 4, description will be given on an example of the silicon thin film forming apparatus wherein the terminally treating step can be carried out in the deposition chamber.

Figure 4:
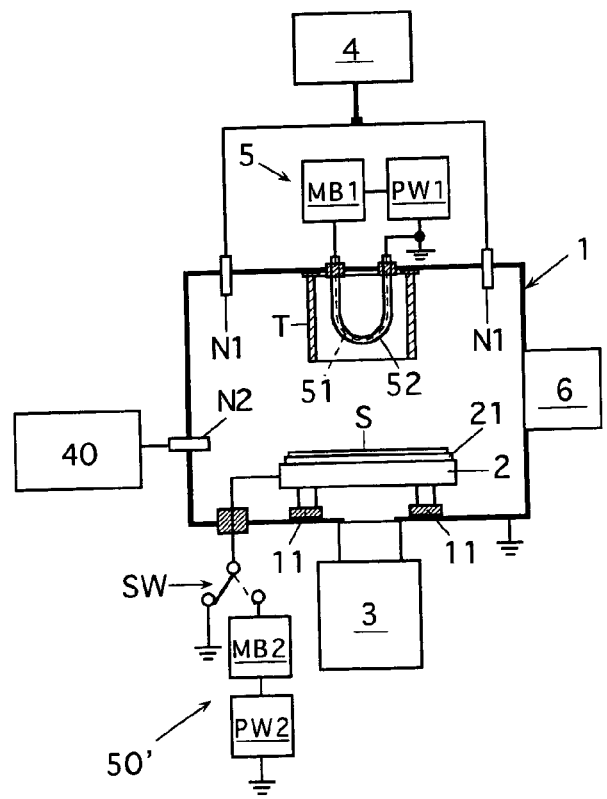
FIG. 4 shows a schematic structure of another example of the apparatus for forming a crystalline silicon thin film according to the invention.

The film forming apparatus shown in FIG. 4 is such that the deposition chamber 1 is utilized as a terminally treating chamber in the apparatus shown in FIG. 1. In the illustrated apparatus, the object holder 2 is arranged in the chamber 1 via an insulating material 11, and is connected to a change-over switch SW. One terminal of the switch SW is grounded and the other is connected to the high-frequency power source PW2 via the matching box MB2 which is a constituent of a high-frequency power applying device 50'.

A terminally treating gas can be supplied into the deposition chamber 1 through a nozzle N2 from the terminally treating, gas supply device 40.

The substantially same parts or the like in the apparatus shown in FIG. 4 as the parts or the like of the apparatus shown in FIG. 1 are indicated with the same reference numerals or symbols as in the apparatus of FIG. 1.

According to the apparatus of FIG. 4, in the silicon thin film forming step prior to terminating treatment, the holder 2 is brought to grounding by operation of the switch SW and a silicon thin film can be formed on the substrate S with use of the hydrogen gas supply device 4 and the high-frequency power applying device 5.

In the terminally treating step, the holder 2 is connected to the power source PW2 by operating the switch SW. The surface of the silicon thin film on the substrate can be terminally treated by use of the terminally treating gas supply device 40 and the high-frequency power applying device 50'.

In the terminally treating step in the apparatus of FIG. 4, preferably the output of the high-frequency power and the internal pressure of the chamber are controlled so that sputtering of silicon sputter target is impeded or is realized in the least degree.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An apparatus for forming a crystalline silicon thin film including:
    a deposition chamber having an object holder for supporting a deposition target object; a silicon sputter target arranged in said deposition chamber; a hydrogen gas supply device supplying a hydrogen gas into said deposition chamber;
    an exhaust device exhausting a gas from said deposition chamber;
    a high-frequency power applying device applying a high-frequency power to the hydrogen gas supplied into said deposition chamber from said hydrogen gas supply device, and thereby forming plasma for effecting chemical sputtering on said silicon sputter target; an optical emission spectroscopic analyzer for plasma obtaining an emission intensity ratio (Hα/SiH*) between an emission spectral intensity Hα of hydrogen atom radicals at a wavelength of 656 nm and an emission spectral intensity SiH* of silane radicals at a wavelength of 414 nm in plasma emission derived from the plasma for chemical sputtering inside said deposition chamber;
    a terminally treating device for terminally treating a surface of the crystalline silicon thin film formed on the deposition target object with plasma for terminating treatment generated by applying a high-frequency power to at least one terminally treating gas selected from an oxygen-containing gas and a nitrogen-containing gas; and
    a control portion comparing the emission intensity ratio (Hα/SiH*) obtained by the optical emission spectroscopic analyzer for plasma with a reference value predetermined within a range from 0.3 to 1.3, and controlling at least one of the magnitude of the power to be applied by the high-frequency power applying device, a supply amount of the hydrogen gas supplied from the hydrogen gas supply device into the deposition chamber, and an exhaust amount of the exhaust device such that the emission intensity ratio (Hα/SiH*) in the plasma in the deposition chamber changes toward the reference value.

2. The apparatus for forming a crystalline silicon thin film according to claim 1, wherein
    the terminally treating device includes a terminally treating chamber which is connected to the deposition chamber and into which the deposition target object bearing the crystalline silicon thin film formed in the deposition chamber is transferred;
    an exhaust device exhausting a gas from the terminally treating chamber; and
    a terminally treating gas supply device supplying at least one terminally treating gas selected from an oxygen-containing gas and a nitrogen-containing gas into the terminally treating chamber; and
    a high-frequency power applying device applying a high-frequency power to the terminally treating gas supplied from the terminally treating gas supply device into the terminally treating chamber to generate plasma for terminating treatment.

3. The apparatus for forming a crystalline silicon thin film according to claim 1, wherein
    the terminally treating device includes said deposition chamber which is allowed to serve as a terminally treating chamber;
    a terminally treating gas supply device supplying at least one terminally treating gas selected from an oxygen-containing gas and a nitrogen-containing gas into the deposition chamber; and
    a high-frequency power applying device applying a high-frequency power to the terminally treating gas supplied from the terminally treating gas supply device into the deposition chamber using the object holder as a high-frequency electrode to generate plasma for terminating treatment.

* * * * *